USO05673041A

United States Patent [19]
Chatigny et al.

[11] Patent Number: 5,673,041
[45] Date of Patent: Sep. 30, 1997

[54] REFLECTIVE MODE ULTRASONIC TOUCH SENSITIVE SWITCH

[76] Inventors: Joseph Victor Chatigny, 1650 Stephens Dr., Wayne, Pa. 19087; Kyung Tae Park, 710 Newtown Rd., Berwyn, Pa. 19312; Minoru Toda, 135 Gadney Rd., Lawrenceville, N.J. 08648

[21] Appl. No.: 518,692

[22] Filed: Aug. 24, 1995

Related U.S. Application Data

[63] Continuation of Ser. No. 220,066, Mar. 30, 1994, abandoned, and Ser. No. 220,070, Mar. 30, 1994, abandoned.

[51] Int. Cl.$^6$ .................................................. H03K 17/94
[52] U.S. Cl. ........................ 341/22; 341/34; 178/18; 178/19; 310/318; 310/328
[58] Field of Search ........................ 345/173, 177; 341/22, 34; 310/317, 318, 321, 322, 328, 333; 178/18, 19

[56] References Cited

U.S. PATENT DOCUMENTS

| | | | |
|---|---|---|---|
| 4,023,156 | 5/1977 | Galvin | 340/274 R |
| 4,328,441 | 5/1982 | Kroeger, Jr. et al. | 310/319 |
| 4,825,212 | 4/1989 | Adler et al. | 340/706 |
| 4,859,996 | 8/1989 | Adler et al. | 340/712 |
| 4,939,402 | 7/1990 | Hirayama et al. | 310/316 |
| 5,072,427 | 12/1991 | Knowles | 367/118 |
| 5,149,986 | 9/1992 | Jalbert | 307/117 |
| 5,159,323 | 10/1992 | Mase et al. | 340/712 |
| 5,162,618 | 11/1992 | Knowles | 178/18 |
| 5,177,327 | 1/1993 | Knowles | 178/18 |
| 5,181,030 | 1/1993 | Itaya et al. | 341/20 |
| 5,231,381 | 7/1993 | Duwaer | 340/712 |
| 5,237,879 | 8/1993 | Speeter | 73/862.041 |
| 5,243,148 | 9/1993 | Knowles | 178/18 |
| 5,260,521 | 11/1993 | Knowles | 178/18 |
| 5,315,205 | 5/1994 | Ohno et al. | 310/357 |
| 5,329,070 | 7/1994 | Knowles | 178/18 |
| 5,380,959 | 1/1995 | Knowles | 178/18 |
| 5,432,671 | 7/1995 | Allavena | 361/280 |
| 5,451,723 | 9/1995 | Huang et al. | 178/18 |
| 5,466,985 | 11/1995 | Suzuki | 310/33 |

OTHER PUBLICATIONS

Patent Abstract (P–1742) vol. 018 No. 273 May 24, 1994, Japan.
Siemens Power Engineering Product News: "The Ultrasonic BERO Proximity Switch—A Remote Sensor: Operating Principle And Comparison With Opto–Electronic Detection"; vol. 4; No. 1; 1984; pp. 6–7.
European Search Report—95301025.3.

Primary Examiner—Jeffery Hofsass
Assistant Examiner—Ashok Mannava

[57] ABSTRACT

A touch sensitive switch is fabricated from a substrate having a touch region on a first surface and a piezoelectric element on a second surface of the substrate. The piezoelectric element is driven by a signal configured so that an ultrasonic wave generated by the element is transmitted into the substrate and is reflected back and forth into the substrate at both surfaces. A touch changes the reflectivity at the first surface, and influences the impedance of the transducer assembly which is comprised of the piezoelectric element and the substrate.

9 Claims, 8 Drawing Sheets

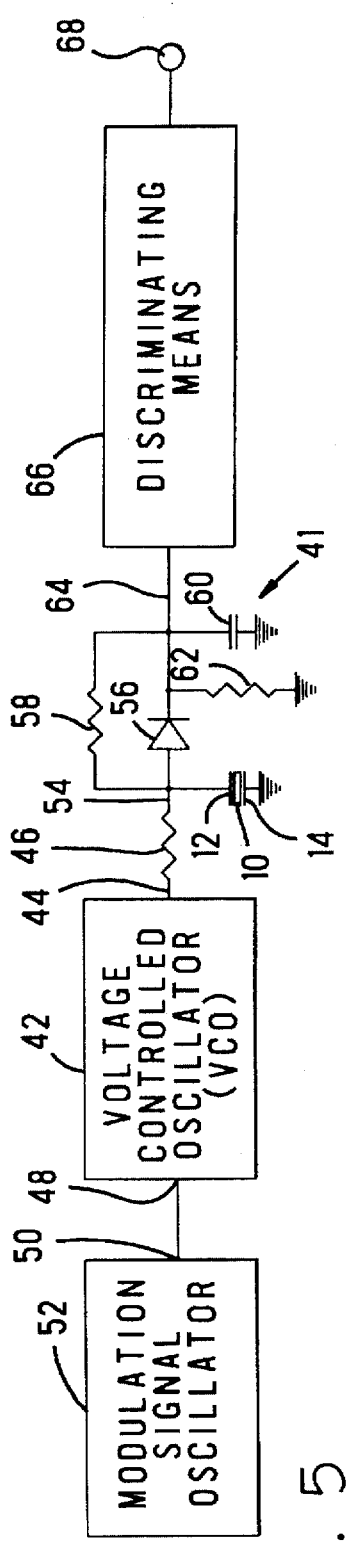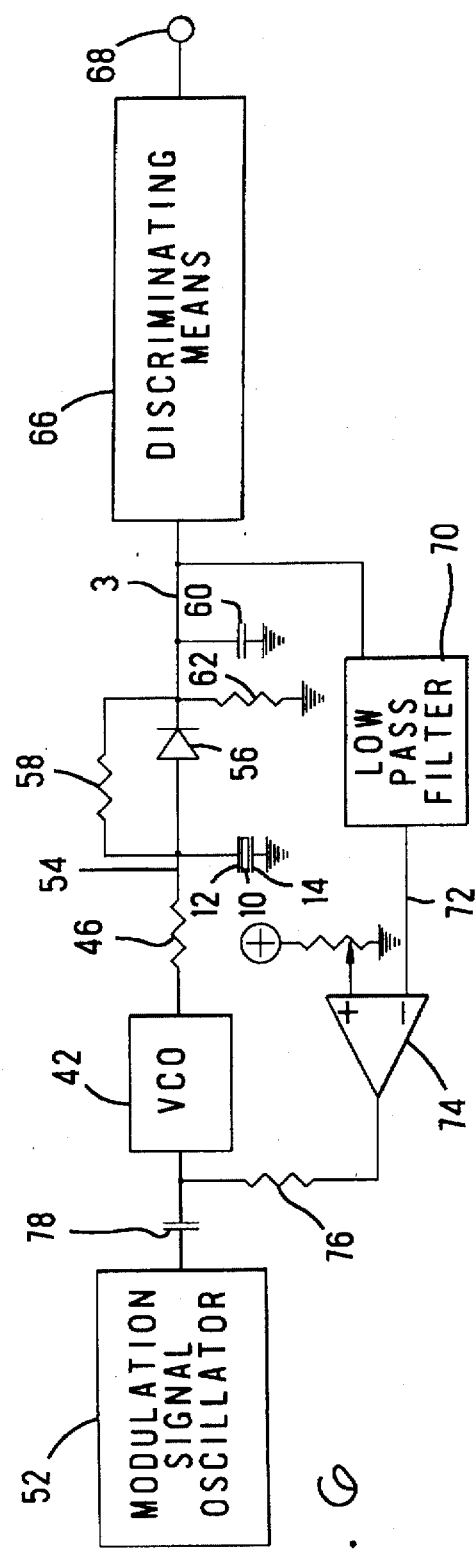

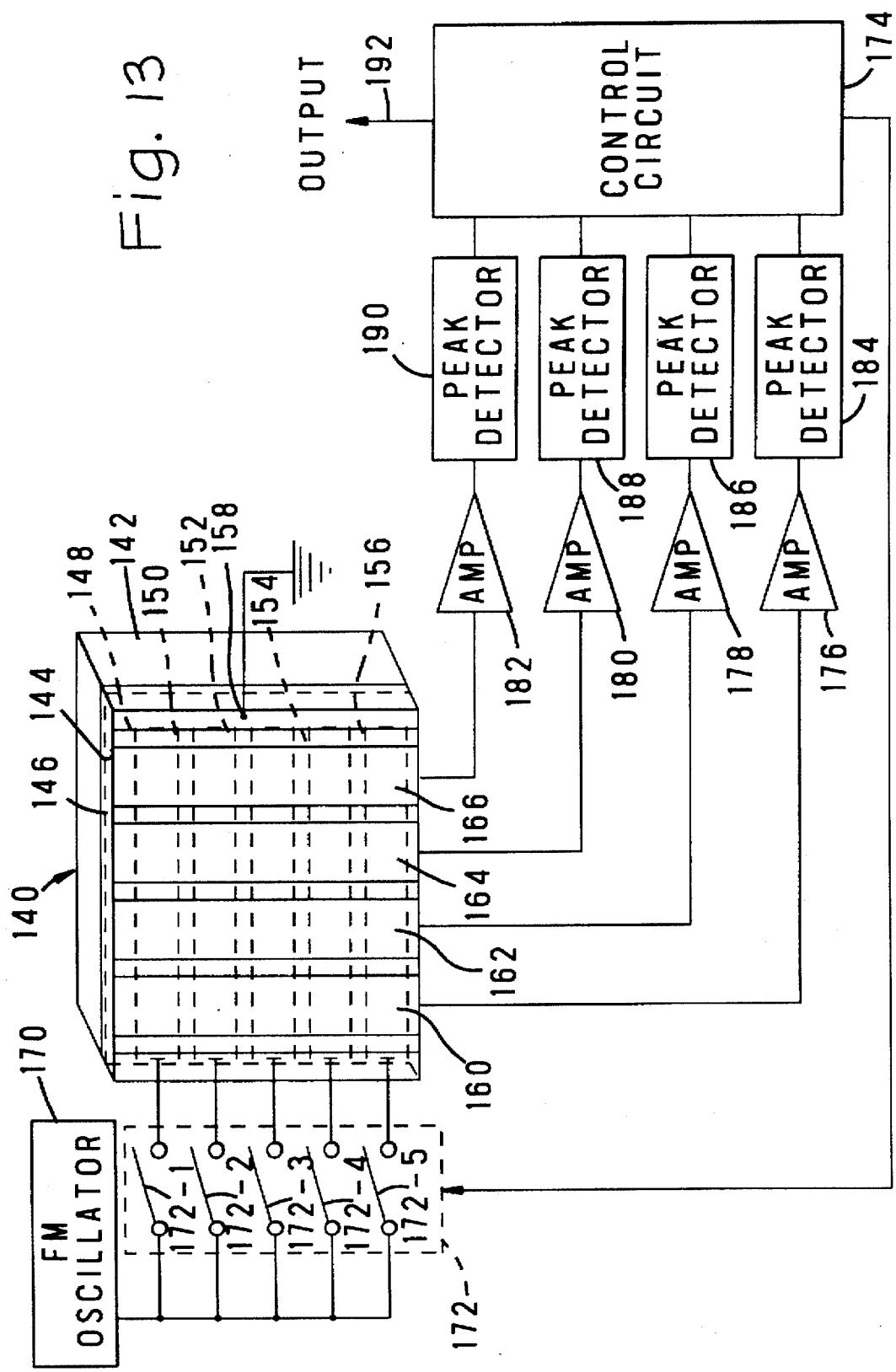

REFLECTIVE MODE ULTRASONIC TOUCH SENSITIVE SWITCH

This application is continuation application of Ser. No. 08/220,066 and 08/220,070 filed Mar. 30, 1994 both now abandoned.

BACKGROUND OF THE INVENTION

This invention relates to touch sensitive switches and, more particularly, to such a switch which operates in accordance with reflective mode ultrasonic principles.

Touch sensitive screens are typically utilized in conjunction with computer generated displays. In such a system, a display screen has displayed thereon different regions each corresponding to a different possible operator response. The operator touches his or her finger to that region of the screen which corresponds to the desired response. Circuitry senses the touch and provides to the computer control system an indication as to which particular region has been touched. Examples of different types of prior art touch responsive systems and some of the problems associated therewith are set forth below.

- A conductive membrane is arranged very close to a large glass surface coated by a transparent conductive layer. Regions of the membrane correspond to particular switches. The membrane is easily damaged by the operator's fingernail or some other sharp edged item. There is also a reliability problem with the electrical contact of such a membrane.
- A surface acoustic wave is transmitted from the peripheral area of a large glass plate. A problem with this approach is propagation loss due to surface contamination which can arise from dust, human skin oils, spittle, etc., which adhere to the plate.
- An array of light emitting diodes and photodetectors is placed in opposed relationship across the surface of a screen. This suffers from contamination on the optical devices which arises from the same origins as described above for surface acoustic waves.
- A transparent piezoelectric force sensing array is placed over the display screen. This array can be damaged by the operator's fingernail or some other sharp edged item. In addition, the surface electrodes wear out over time. Another disadvantage is that sensitivity of such a sensor is high when tapped, but is low for a gradually increasing force.

It is therefore an object of the present invention to provide a touch sensitive switch which is immune to the aforedescribed problems.

SUMMARY OF THE INVENTION

The foregoing and additional objects are attained in accordance with the principles of this invention by providing a touch sensitive switch comprising a substrate having a touch region on a first surface and a piezoelectric element secured to the substrate on a second opposed parallel surface of the substrate across the substrate from the touch region. The piezoelectric element is driven by a drive signal and is so configured that an ultrasonic wave generated by the piezoelectric element is transmitted into the substrate to set up an ultrasonic wave within the substrate which is reflected back and forth into the substrate at both surfaces thereof. Finger contact at the touch region changes the reflectivity at that first surface, and influences the impedance of the transducer assembly (the piezoelectric element together with the substrate). By examining the resultant signal on the electrodes, this impedance variation is detected.

In accordance with an aspect of this invention, the drive signal is a frequency modulated signal and detection of the impedance variation is effected by a frequency modulation to amplitude modulation conversion.

In accordance with another aspect of this invention, the piezoelectric element comprises piezoelectric polymer film.

In another embodiment of the invention a touch sensitive switch comprising a substrate having a touch region on a first surface and a first piezoelectric element secured to the substrate on a second opposed parallel surface of the substrate across the substrate from the touch region. A second piezoelectric element is secured to the first piezoelectric element in superposed relation. The first piezoelectric element is driven by a drive signal and is so configured that an ultrasonic wave generated by the first piezoelectric element is transmitted to the substrate to set up an ultrasonic wave within the substrate which is reflected back and forth into the substrate at both surfaces thereof. Finger contact at the touch region changes the reflectivity at the first surface and, accordingly, the strength of the reflected wave. The second piezoelectric element acts as a receiver and the output from the second piezoelectric element is evaluated to determine whether the touch region has been contacted.

In accordance with an aspect of this invention, the first and second piezoelectric element each comprises piezoelectric polymer film.

In accordance with another aspect of this invention, the drive signal is a frequency modulated signal having a center frequency greater than the resonant frequency of the first piezoelectric element and being a frequency close to a resonant frequency of the assembly of the substrate together with the first and second piezoelectric elements. The modulation of the drive signal is a fixed frequency of sufficient value to insure that the drive signal has a frequency component equal to the resonant frequency, and a peak detector is provided for use in evaluating the output from the second piezoelectric element.

BRIEF DESCRIPTION OF THE DRAWINGS

The foregoing will be more readily apparent upon reading the following description in conjunction with the drawings in which like elements in different figures thereof are identified by the same reference numeral and wherein:

FIG. 5 is a block diagram showing illustrative circuitry according to this invention for responding to a touch;

FIG. 6 is a block diagram showing the illustrative circuitry of FIG. 5 with a first embodiment of compensating circuitry appended thereto;

FIG. 13 shows a matrix array of touch sensitive switches constructed in accordance with this invention.

DETAILED DESCRIPTION

Figure 1:
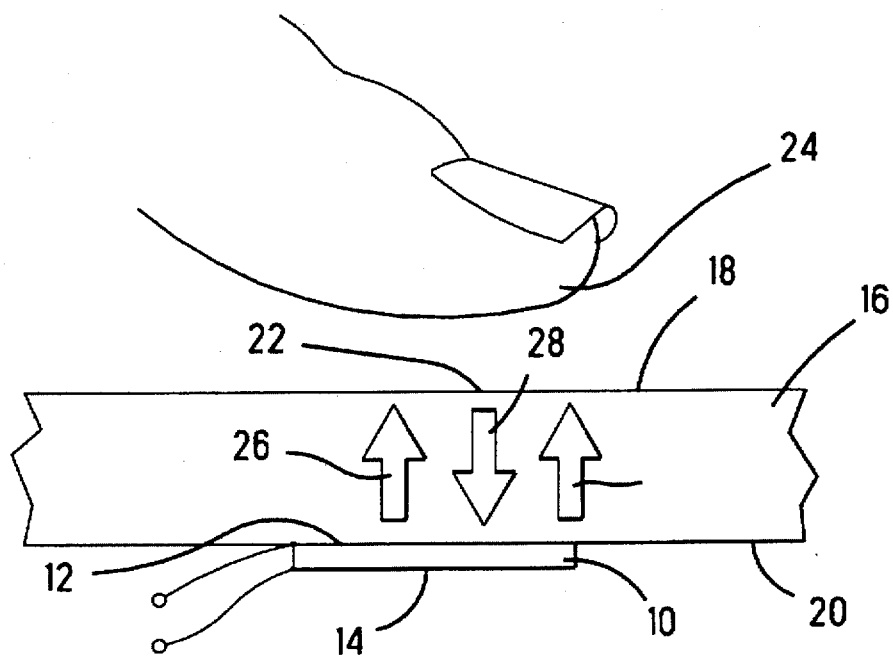
FIGS. 1 and 2 illustrate schematically the principles of operation of the touch sensitive switch according to this invention.
Figure 2:
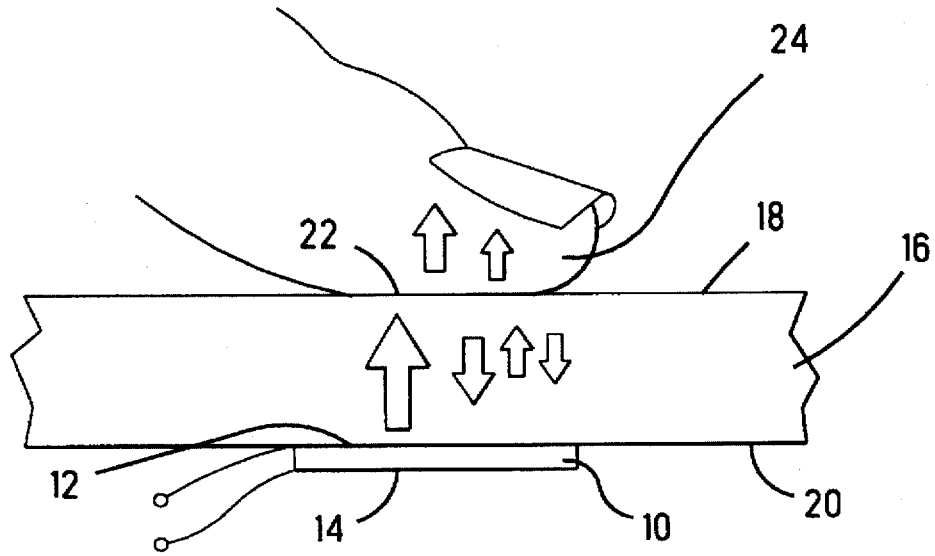

In accordance with this invention, and as shown in FIGS. 1 and 2, a piezoelectric element 10, preferably a piezoelectric polymer material such as polyvinylidene fluoride (PVDF) or polyvinylidene fluoride-trifluoroethylene (PVDF-TrFE) in film form, has electrodes 12 and 14 on opposed surfaces. A substrate 16, illustratively glass, has first and second opposed parallel surfaces 18 and 20. On the first surface 18 of the substrate 16 there is a defined touch region 22, preferably of a size approximately equal to the contact area of an operator's finger 24. The electrode 12 is bonded on the second surface 20 of the substrate 16 across the substrate 16 from the touch region 22. The touch region 22 can be defined as part of a computer generated display, in which case the substrate 16, the piezoelectric element 10 and the electrodes 12 and 14 will be transparent, or the touch region 22 can be defined by indicia on the surface 18.

Figure 3:
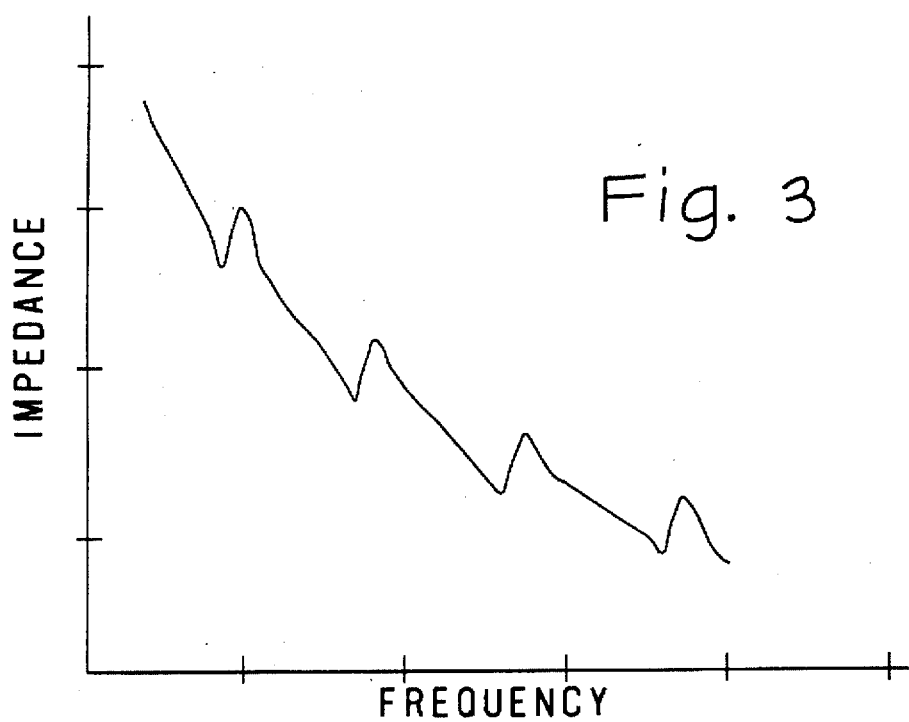
FIG. 3 illustrates the impedance-frequency curve of the transducer assembly shown in FIG. 1.

When a high frequency voltage is applied across the electrodes 12 and 14, the varying electric field across the piezoelectric element 10 induces a vibration across the thickness of the piezoelectric element 10. When the frequency of this varying electric field is between the one-half of the resonant frequency $f_o$ of the piezoelectric element 10 and five times that resonant frequency, an ultrasonic wave is more efficiently radiated into the substrate 16 and propagates toward the surface 18, as indicated by the arrow 26. This given range is intended to be instructional and in no way is intended to be limiting. This wave is reflected at the surface 18 and propagates back toward the piezoelectric element 10, as indicated by the arrow 28. When this wave reaches the surface 20, it is again reflected, as indicated by the arrow 30. Eventually, the wave dies down since there is some loss at each reflection as well as propagation loss. Since the reflected waves are converted to electric current in the piezoelectric element 10, the impedance of the piezoelectric element 10 is influenced by the reflection. When a high frequency drive voltage is applied to the electrodes 12 and 14, many waves propagate back and forth through the substrate 16. At certain frequencies, the phases of all the waves going toward the surface 18 agree and the phases of all the waves going toward the surface 20 also agree. This produces very sharp resonant peaks which may be called "substrate resonance". This is different from "transducer resonance" which has a much broader peak. The substrate resonance is characterized by a series of peaks on the impedance-frequency curve, as illustrated in FIG. 3.

The sharpness of the substrate resonance depends on propagation losses and reflectivity at the surfaces. If the propagation loss is negligibly small, the resonant peak mostly depends on the reflectivity at the surfaces of the substrate. For example, if propagation loss is zero and the reflectivity is 100%, the resonant peak height is infinite. If the reflectivity is reduced to 90%, the resonant peak deceases to a finite value. This change of the resonant peak is not 10%, but instead is very much larger (i.e., from infinity to a finite value). This means that the substrate resonance has a function of amplification for reflectivity changes. Lower propagation loss induces more amplification for a change in surface reflectivity. Since the propagation loss (dB/cm) is proportional to frequency, a thicker piezoelectric element transducer with lower resonant frequency is more desirable. (As stated above, the wave excitation is most efficient between 0.5 $f_o$ and 5 $f_o$, where $f_o$ is the resonant frequency of the transducer.)

FIG. 2 illustrates the situation where the operator's finger 24 engages the touch region 22. In this case, instead of an air boundary at the surface 18 which provides high reflectivity to the waves within the substrate 16, contact by the finger 24 lowers the reflectivity at the surface 18 by absorbing some of the ultrasonic energy. This changes the multiple reflections back to the piezoelectric element 10 which in turn changes the induced electric current in the piezoelectric element 10, thereby changing the effective impedance of the piezoelectric element 10.

The foregoing principles may be described quantitatively as follows. The resonant frequency ($f_o$) of the piezoelectric element 10 bonded on an infinitely thick, hard and heavy material is given by:

$$f_o = 4 V_p/T_p \qquad (1)$$

where $V_p$ is the sound velocity in the piezoelectric material and $T_p$ is the thickness of the piezoelectric material. When the piezoelectric material is PVDF-TrFE co-polymer, $V_p = 2.3 \times 10^3$ m/sec. This resonance is caused by the mass of the piezoelectric material and its elastic property. Therefore, the vibration becomes stronger at around $f_o$ with width around $\pm 0.1 f_o$. However, in the present case, the substrate thickness is finite and resonates at a very broad frequency range. At these substrate resonant frequencies, the effective acoustic impedance becomes very low, resembling a substrate of infinitely thick rubber or water. When polymer piezoelectric material is mounted on rubber (or placed on water), it is known that ultrasonic waves are generated in a very broad frequency band. Therefore, this transducer has the capability to excite ultrasonic waves in a very broad ban outside of the regular transducer resonance bandwidth, only when the substrate is resonated.

The substrate resonances take place at a series of frequencies given by $$f_N = N V_g/(2 T_g) \quad N=1, 2, 3 \qquad (2)$$

where $V_g$ is the sound velocity in the substrate and $T_g$ is the thickness of the substrate. When the substrate 16 is glass, then $V_g = 5{,}440$ m/sec. Illustratively, $T_g = 3.2$ mm.

The peak height of the resonance is proportional to $$h = 1/[1 - |R| \exp(-W t_g/V_g Q_m)] \qquad (3)$$

where R is the reflectivity at the surface of the substrate, w is the angular frequency (i.e., $w = 2\pi f$) and $Q_m$ is the mechanical quality factor of the substrate. When the substrate is glass, $Q_m = 694$.

$$R = (pV - p_g V_g)/(pV + p_g V_g) \qquad (4)$$

where $p_g$ is the density of the substrate material, and p and V are the density and sound velocity, respectively, of the material contacted at the substrate surface. When the substrate is glass, then $p_g = 2.42 \times 10^3$ Kg/m$^3$. When there is air at the surface of the substrate, then $p_g = 1.2$ Kg/m$^3$ and V=344 m/sec. For human muscle contacting the substrate surface, $p = 1.05 \times 10^3$ Kg/m$^3$ and V=1.540 m/sec. Accordingly, |R| is 1.0 for air and 0.78 for human muscle, assuming 100% surface contact without fingerprint grooves. However, based on the top area of the ridges of a finger print which actually contacts the substrate surface, |R| is estimated to be 0.97.

Thus, without finger contact, |R|=1 and according to equation (3), the height h of the piezoelectrically generated current due to the reflection ($I_p$) is 48.7 at a frequency of 3.9 MHz. When a finger contacts the substrate surface, |R|=0.97 and h becomes 20.0. This small change in the value of the reflectivity from 1 to 0.97 produces a large change of h from 48.7 to 20.0, which is a 59% reduction. The above-mentioned reflection current $I_p$ is added to the capacitive current which is much larger and 90° out of phase.

Experimental results confirm the foregoing. Specifically, when the drive frequency to the transducer shown in FIG. 1 was varied and the capacitance and resistance across the electrodes 12 and 14 was measured by an impedance analyzer, the resulting impedance-frequency curve is as shown in FIG. 3. Because of the phase difference and the large capacitive current, the impedance curve shows a dip and a peak at each substrate resonance, and its stepwise variation is small. Thus, as the frequency increases, the impedance generally decreases except for steep positive slope gradients at the various substrate resonant frequencies. The present invention makes use of those positive slopes, as illustrated in FIG. 4.

Figure 4:
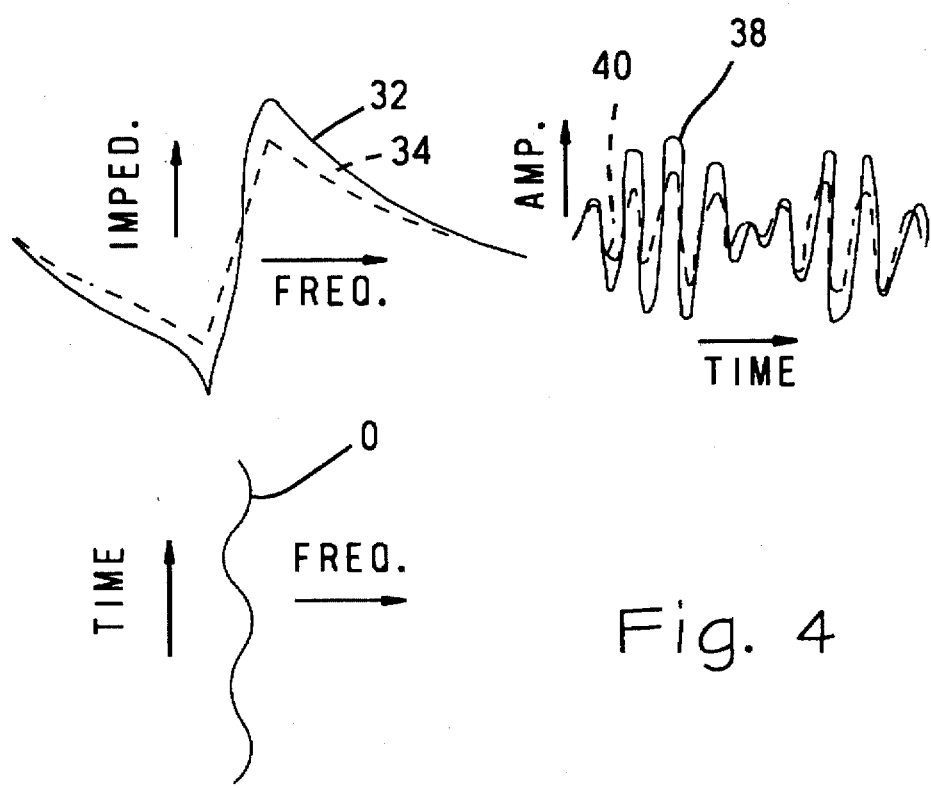
FIG. 4 illustrates conversion of the frequency modulated drive signal into an amplitude modulated signal according to this invention.

FIG. 4 shows the impedance-frequency curve from the transducer assembly without finger contact in the region of one of the substrate resonances as the solid line 32. The broken line 34 is the impedance-frequency curve in the same frequency region with finger contact, as illustrated in FIG. 2. The curve 36 is the frequency-time curve for a transducer drive signal having a center frequency substantially centered at the mid-frequency point of the positive slope region of the curve 32 which is frequency modulated by a fixed frequency signal. When the drive signal characterized by the curve 36 is applied to the electrodes 12 and 14, the interaction with the impedance curve 32 (without finger contact) results in the amplitude modulated signal shown by the solid line curve 38. When the impedance-frequency curve due to finger contact is shown by the broken line 34, there results the amplitude modulated signal shown by the broken line curve 40. Thus, since finger contact reduces the slope of the frequency-impedance curve, the resultant amplitude modulated signal has a lower amplitude than the case where there is no finger contact. FIG. 5 schematically illustrates basic circuitry 41 operating in accordance with the principles of this invention, as discussed above. The frequency modulated drive signal is generated by the voltage controlled oscillator (VCO) 42 having an output 44 coupled to the electrode 12 through the resistor 46 and an input 48 coupled to the output 50 of a modulation signal oscillator 52. The center frequency of the voltage controlled oscillator 42 is chosen to be substantially at the center of one of the positive slope regions of the impedance-frequency curve and is preferably in the range between one half the resonant frequency of the piezoelectric element 10 and five times that resonant frequency. In one example, the substrate 16 was glass of thickness 3.2 mm and the piezoelectric element 10 was a 200 μ thick film of PVDF-TrFE. The center frequency of the voltage controlled oscillator 42 was 3.9 MHz and the modulation signal oscillator 52 operated at 1 KHz.

Conversion of the frequency modulated drive signal on the lead 54 is converted to an amplitude modulated signal, as discussed above with reference to FIG. 4, and is then demodulated by the network comprising the piezoelectric element 10 with its electrodes 12 and 14, the diode 56 having one terminal connected to the electrode 10, the resistor 58 connected across the diode 56, the capacitor 60 coupled between the other terminal of the diode 56 and the electrode 14, and the resistor 62 connected across the capacitor 60. The demodulated amplitude modulated signal appears on the lead 64, which is an input to the discriminating means 66. The discriminating means 66 evaluates the level of the demodulated amplitude modulated signal on the lead 64 to determine whether or not finger contact has occurred, finger contact resulting in the level of the demodulated amplitude modulated signal being below a predetermined threshold value. When finger contact is detected, an output signal is applied to the terminal 68.

As is known, the acoustic velocity of glass, used as the substrate 16, is temperature dependent, so that the resonant frequencies given in equation (2) are also temperature dependent. Further, the center frequency of the voltage controlled oscillator 42 may drift, due in part to temperature changes and in part to variations in its supply voltage. For the present invention to function at its best, the modulated frequency of the voltage controlled oscillator 42 should always be within the region of positive slope of the impedance-frequency curve. FIG. 6 shows a first embodiment of compensating circuitry appended to the circuitry shown in FIG. 5. The demodulated amplitude modulated signal on the lead 64 includes a DC signal component which is proportional to the impedance value of the transducer. Thus, the low pass filter 70 has its input connected to the lead 64 and its output on the lead 72 only contains this DC component. The DC component on the lead 72 is applied as one input to the comparator 74, whose other input has a reference voltage applied thereto. The output of the comparator 74 is applied to the input of the voltage controlled oscillator 42 through the resistor 76 to provide a bias voltage to bring the center frequency of the voltage controlled oscillator 42 to the appropriate value. The capacitor 78 isolates the oscillator 52 from the DC bias.

Figure 7:
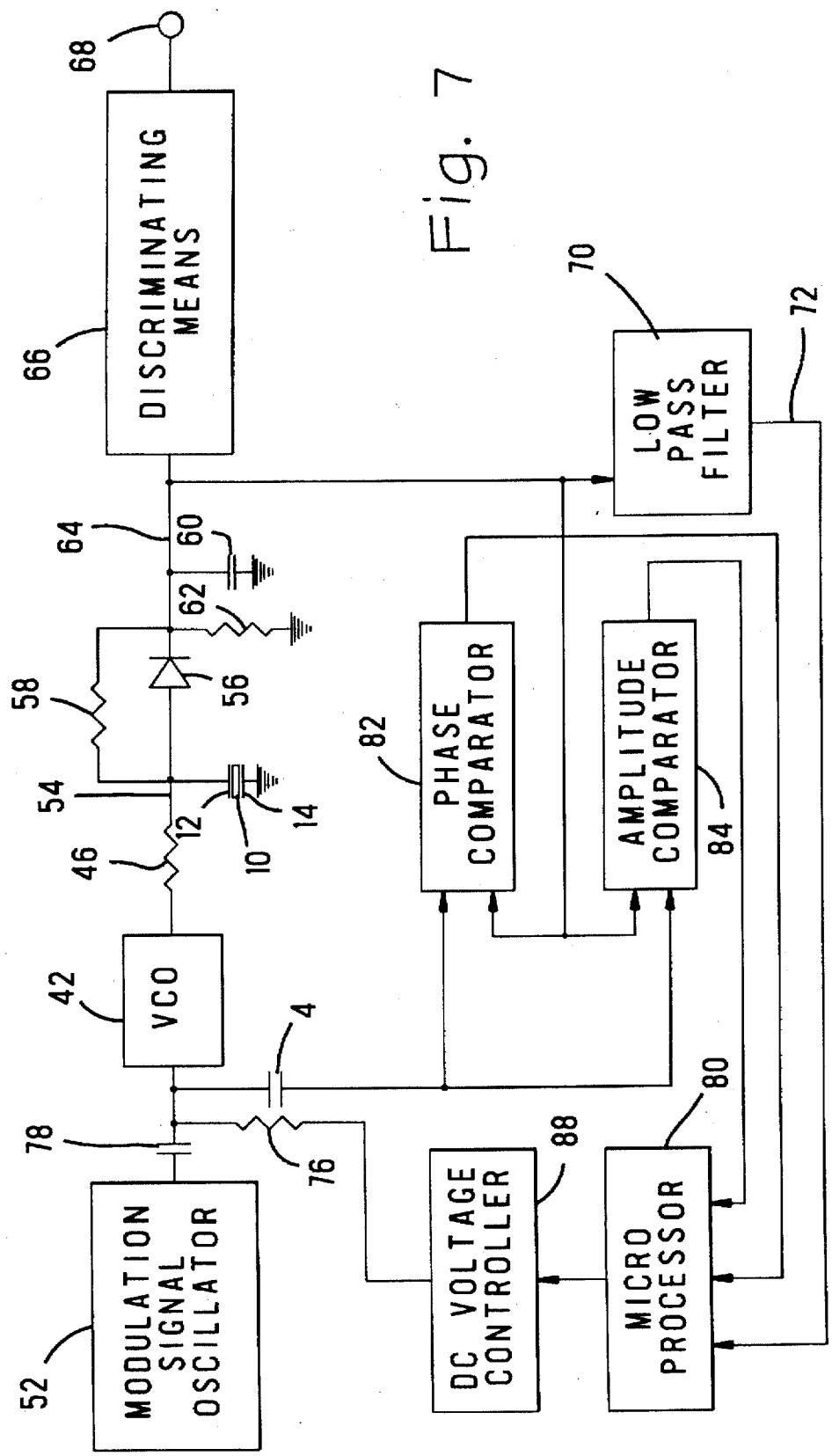
FIG. 7 is a block diagram showing the illustrative circuitry of FIG. 5 with a second embodiment of compensating circuitry appended thereto.
Figure 8A:
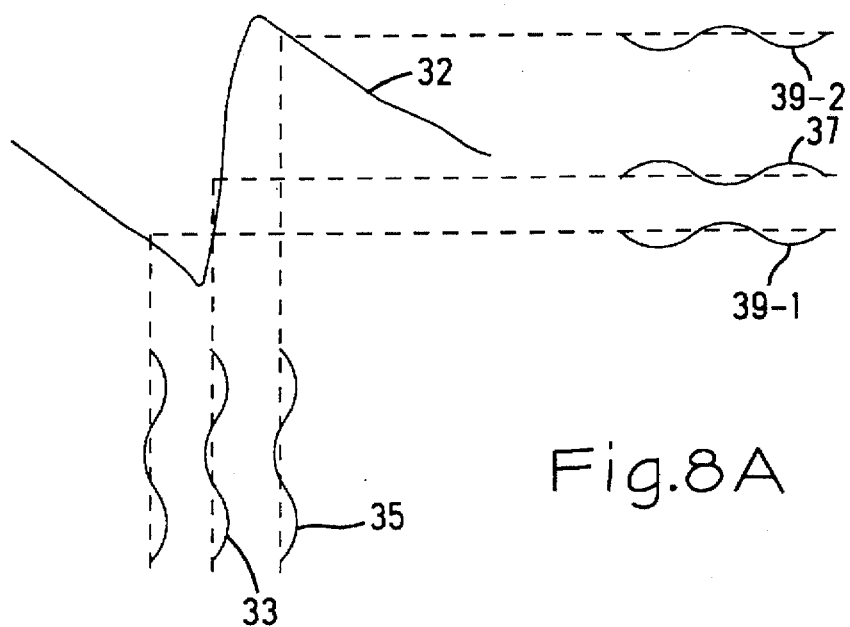
FIGS. 8A and 8B illustrate the output voltages of the FM to AM conversion circuit including the touch sensitive device when the drive signal center frequency drifts and are useful for understanding the operation of the compensating circuitry.
Figure 8B:
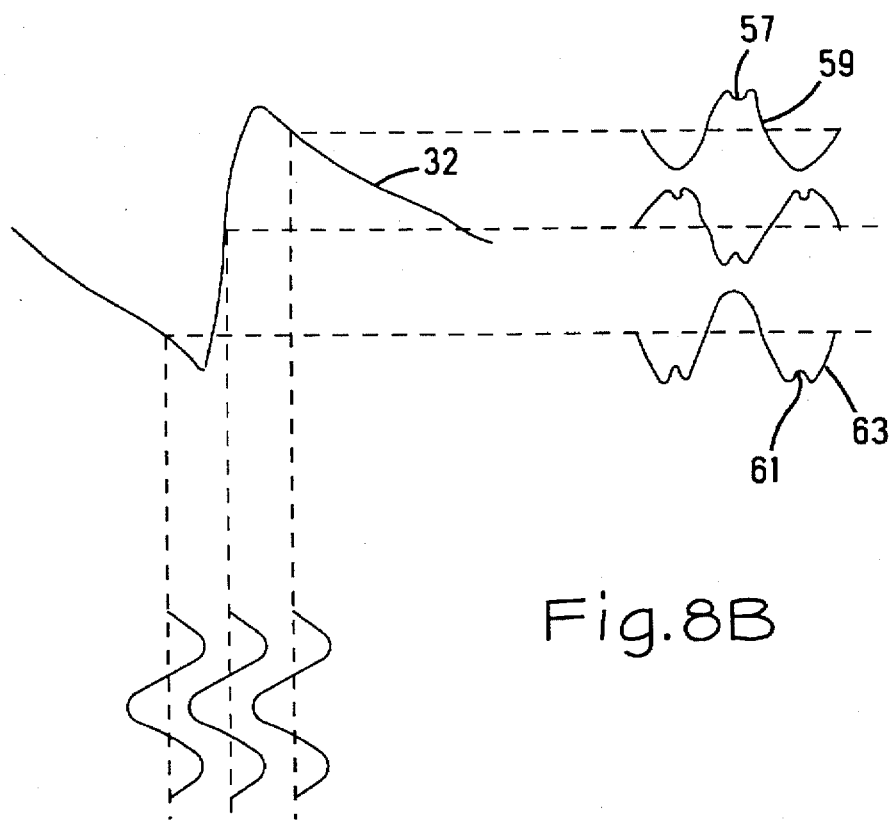

FIG. 7 illustrates improved compensating circuitry, utilizing a microprocessor 80, appended to the circuitry of FIG. 5. FIGS. 8A and 8B show the output voltage on the lead 64 of the FM to AM conversion circuit 41 (FIG. 5) and, when considered in conjunction with FIG. 7, will assist in explaining the operation of this compensating circuitry. Thus, as shown in FIG. 7, the demodulated amplitude modulated signal on the lead 64 is applied as an input to the low pass filter 70, the phase comparator 82, and the amplitude comparator 84. The other input to the phase comparator 82 and the amplitude comparator 84 is the input signal to the voltage controlled oscillator 42, without the DC component thereof which is filtered by the capacitor 86. The outputs of the low pass filter 70, the phase comparator 82, and the amplitude comparator 84 are applied as inputs to the microprocessor 80, which processes the signals and causes the DC voltage controller 88 to provide the appropriate bias to the voltage controlled oscillator 42. As shown in FIG. 8A, when the center frequency 33 of the voltage controlled oscillator 42 slightly drifts to the higher side from the desirable center frequency 33 of the positive slope region of impedance-frequency curve 32, the DC component of the output signal on the lead 64 is fed to the microprocessor 80 through the low pass filter 70. The microprocessor 80 controls the VCO 42 through the DC voltage controller 88 to lower the center frequency 33. However, when the center frequency 35 is outside of the steep region (desirable region), the center frequency 35 has to be lowered much more. To detect whether the center frequency is outside or within the steep region, the phase of the output signal on the lead 64 is compared with the phase of the input signal to the VCO 42 using the phase compensator 82. As shown in FIG. 8A, the phase of the signal 37 for the center frequency being within the steep region is opposite to the phase signals 39-1 and 39-2 for the center frequency being outside the steep region.

In order to detect whether the center frequency is above or below the steep region, the modulation frequency is increased and the output signal on the lead 64 is compared with the input signal to the VCO 42. As shown in FIG. 8B, when the center frequency is above the steep region, a small dip 57 appears at the top of the waveform 59. On the contrary, when the center frequency is below the steep region, a small peak 61 appears at the bottom of the waveform 63.

Turning to FIGS. 9–13, we see another embodiment of the invention in which a double layer structure is utilized. Specifically, when the drive frequency to the transducer shown in FIG. 1 was varied and the capacitance and resistance across the electrodes 12 and 14 was measured by an impedance analyzer, the resulting impedance-frequency curve is as shown in FIG. 3. Because of the phase difference and the large capacitive current, the impedance curve shows a dip and a peak at each substrate resonance, and its stepwise variation is small. Thus, as the frequency increases, the impedance generally decreases except for steep positive slope gradients at the various substrate resonant frequencies. In essence, the variation of the transducer impedance due to multiple reflections is generally small because the current in the capacitive impedance is much larger than the current induced by multiple reflections, and the detection of the impedance variation due to the finger contact is not easily detected. For example, application of a continuous sinusoidal current to the transducer and measuring the voltage across the terminals of the transducer require substraction of larger voltage by the larger capacitive impedance in order to detect small signals due to reflections.

When the generating transducer and receiving transducers are separated (a double layer structure), the driving voltage to detect the reflections appears on the receiving transducer but is smaller in magnitude and is almost the same amplitude as that of the reflectional signal. The directly induced signal and the reflectional signal are in-phase or out-of-phase depending on the driving frequency and the propagation length.

Figure 9:
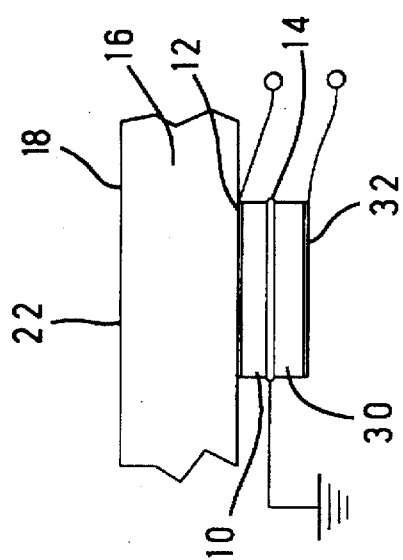
FIG. 9 illustrates a double layer transducer assembly according to the present invention.

FIG. 9 shows the transducer assembly according to the present invention. In addition to the piezoelectric element 10, a second piezoelectric element 30, preferably also PVDF or PVDF-TrFE, is provided in superposed relation to the first piezoelectric element 10. The piezoelectric element 30 shares the electrode 14 with the piezoelectric element 10 and also has its own electrode 32 on the opposite side from the electrode 14. The common electrode 14 is grounded, as shown. According to the present invention, the piezoelectric element 10 functions as an ultrasonic transmitter and the piezoelectric element 30 functions as an ultrasonic receiver. The present invention can also operate with the piezoelectric element 30 as the transmitter and the piezoelectric element 10 as the receiver.

Figure 10:
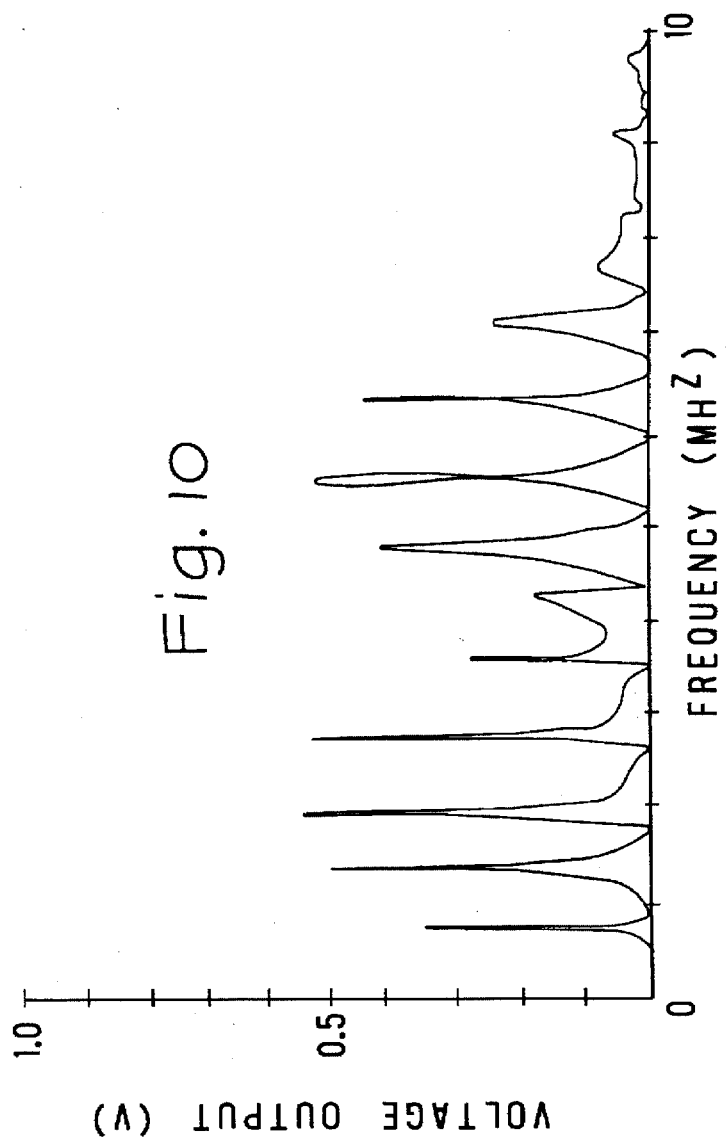
FIG. 10 is a curve of output voltage as a function of frequency for a specific example of the assembly shown in FIG. 9, calculated using Mason's model.

When a drive signal is applied to the piezoelectric element 10 across the electrodes 12 and 14, the piezoelectric element 10 generates an ultrasonic wave which is radiated into the substrate 16 as well as into the piezoelectric element 30. The piezoelectric element 30 is sensitive to both the directly generated wave and the reflected wave. The phase relationship between the generated wave and the reflected wave varies in accordance with the frequency to produce an output from the piezoelectric element 30 across the electrodes 14 and 32 which also varies with frequency. This output has resonant peaks at a series of resonant frequencies. FIG. 5 shows the output from the piezoelectric element 30 as a function of frequency, calculated in accordance with Mason's model. Specifically, this calculation was based upon the substrate 16 being 3 mm thick glass and each of the piezoelectric elements 10 and 30 being 200 μ thick PVDF-TrFE film. The periodicity of the frequency response shown in FIG. 10 is slightly irregular because the resonance of the transducer and its harmonic resonance influences the resonance in the substrate. As shown, the voltage output varies from zero to peak values as the frequency varies. The peak values are significantly influenced by finger contact to the touch region 22. Such contact reduces each peak by a factor of 20% to 50%. The present invention recognizes this to detect finger touch by detecting the variation of the voltage output at a specified peak frequency.

Figure 11:
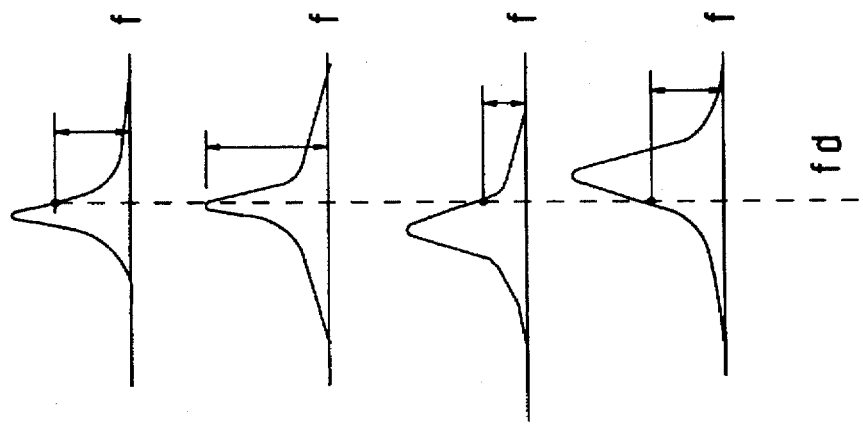

When the aforedescribed touch sensitive switch utilizing a double layer transducer is applied to a touch screen or keypad having an array of touch regions, many transducer sections are utilized. In such a multiple element system, the resonant frequency of each section may not be exactly equal because of non-uniform thickness of the substrate, the piezoelectric layer or the bonding layer. Thus, for a multiple transducer system operating at a predetermined frequency, the output voltage from each transducer is not of equal value because the frequency of the drive signal is not necessarily at a peak because the peak frequency varies from one transducer to another. This is illustrated in FIG. 11 which shows a drive signal at a fixed frequency $f_d$ and the output voltage versus frequency curve in the region of the frequency $f_d$ for four different transducer sections. It is seen that the output voltage varies in dependence upon where the frequency $f_d$ is vis-a-vis the frequency at the local resonant peak.

Figure 12:
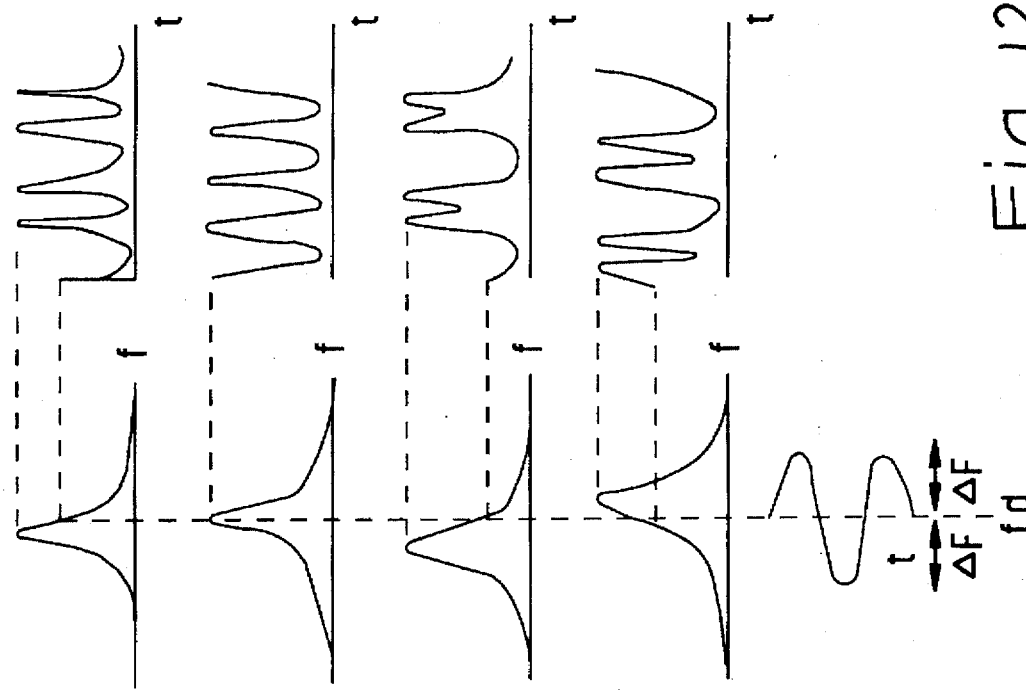
FIGS. 11 and 12 show differences in the output voltages for fixed frequency drive signals and frequency modulated drive signals, respectively.

To overcome this problem, it is desirable to utilize a frequency modulated drive signal. As illustrated in FIG. 12, if the frequency deviation of the modulated drive signal ($f=f_d \pm f$) covers a sufficient frequency range that the drive signal has a frequency component equal to the frequency at the local resonant peak, the output signal will always reach the peak. Accordingly, a peak detector can be utilized in determining whether or not there has been a touch.

FIG. 13 illustrates a matrix array of touch sensitive switches constructed in accordance with this invention. As shown, there are twenty switches in a matrix array having five rows and four columns. Thus, the switch array 40 includes a substrate 42, illustratively glass, to which is secured a first layer 44 of piezoelectric film and a second layer 46 of piezoelectric film. The layer 44 has on its surface adjacent the substrate 42 five elongated electrode strips 48, 50, 52, 54 and 56, arranged horizontally and parallel to each other. Between the layers 44 and 46 is a grounded common electrode 58. On the surface of the film layer 46 remote from the substrate 42 are four elongated electrode strips 60, 62, 64 and 66, arranged vertically and parallel to each other. The superposed intersections of the horizontal electrode strips 48–56 with the vertical electrode strips 60–66 form a five by four matrix array of switch elements, each corresponding to a defined touch region on the opposite side of the substrate 42. Preferably, the film layers and the electrodes are transparent. A commonly used material for transparent electrodes is indium tin oxide. To improve the conductivity of such electrodes, without sacrificing much of their transparency, a mesh metallization of aluminum or silver may be utilized.

In the embodiment shown in FIG. 13, the layer 44 operates as the ultrasonic transmitter and the layer 46 operates as the ultrasonic receiver. Accordingly, drive signals are applied to the electrode strips 48–56 and output voltages are taken from the electrode strips 60–66. As discussed above, it is preferred that the drive signal be in the form of a frequency modulated signal. Accordingly, there is provided a frequency modulated oscillator 70 whose output is applied to a switch bank 72. The switch bank 72 includes five selectively controllable switches 72-1, 72-2, 72-3, 72-4 and 72-5, each connected in common at one side to the output of the oscillator 70 and at their other side each to one of the drive electrode strips 48–56. Although shown as mechanical switches, the switches within the switch bank 72 may be electronic switches, such as field effect transistors. Control of the switches within the switch bank 72 is effected by the control circuit 74, as will be described in full detail hereinafter.

Each of the sense electrode strips 60–66 is connected to the input of a respective amplifier 76, 78, 80, 82, the outputs of which are connected to the inputs of respective peak detector circuits 84, 86, 88, 90. The outputs of the peak detector circuits 84–90 are provided as inputs to the control circuit 74. The control circuit 74 includes circuitry for comparing the outputs from the peak detectors 84–90. Since, as discussed above, finger contact results in a reduced output voltage, comparison of the outputs of the peak detectors 84–90 allows a determination of whether there has been finger contact, and if so, along which vertical column. Knowing which vertical column has the finger contact and knowing which horizontal row has the drive signal applied thereto, enables the control circuit 74 to provide an output at 92 indicative of a touch and identifying which switch element has responded to the touch.

In operation, the control circuit 74 functions to close the switches 72-1, 72-2, 72-3, 72-4, 72-5 one at a time in a predetermined sequence. With one of the switches closed, the drive signal from the oscillator 70 is applied to one of the drive electrode strips 48–56. The peaks of the output voltages from the receive electrode strips 60–66 are compared. If one of the peak output voltages is less than a predetermined fraction of the other output voltages, this indicates that a touch has occurred. Knowing the horizontal and vertical addresses (i.e., the identities of the horizontal row and vertical column electrode strips) of the touched crosspoint, the control circuit 74 can provide this information at its output 92. Accordingly, there has been disclosed an improved reflective mode ultrasonic touch sensitive switch. While illustrative embodiments of the present invention have been disclosed herein, it is understood that various modifications and adaptations to the disclosed embodiments will be apparent to those of ordinary skill in the art and it is intended that this invention only be limited by the scope of the appended claims.

What is claimed is:

1. A reflective mode ultrasonic touch sensitive switch comprising:

a substrate having first and second opposed parallel surfaces, said first surface having a touch region thereon;

a piezoelectric element having first and second generally planar and parallel opposed surfaces and an electrode on each of said piezoelectric element surfaces, said piezoelectric element being secured in parallel relation to said substrate second surface across said substrate from said touch region;

drive means coupled to said electrodes for applying a frequency modulated drive signal to said electrodes, the center frequency of said frequency modulated drive signal being a frequency where the impedance-frequency curve of the assembly of said piezoelectric element together with said substrate exhibits a positive slope;

detection means coupled to said electrodes for providing a demodulated amplitude modulated signal derived from said drive signal; and discriminating means coupled to receive said demodulated amplitude modulated signal from said detection means for evaluating said demodulated amplitude modulated signal and providing an output signal indicative of a finger touch to said touch region.

2. The switch according to claim 1 wherein said piezoelectric element comprises piezoelectric polymer film.

3. The switch according to claim 1 wherein said discriminating means responds to the level of said demodulated amplitude modulated signal being below a predetermined threshold value for providing said output signal.

4. The switch according to claim 1 wherein said drive means comprises:

a voltage controlled oscillator having an input and an output;

a modulation signal source having an output coupled to said oscillator input; and means for coupling said oscillator output to said electrodes.

5. The switch according to claim 4 wherein said detection means comprises:

a diode having two terminals;

a resistor connected across said diode;

means for coupling a first terminal of said diode to one of said piezoelectric element electrodes;

a capacitor coupled between the other terminal of said diode and the other of said piezoelectric element electrodes; and means for coupling said other terminal of said diode to said discrimination means.

6. The switch according to claim 4 further including compensation means for maintaining the center frequency of said drive means within the positive slope region of the impedance-frequency curve.

7. The switch according to claim 6 wherein said compensation means comprises:

means for extracting a DC signal from said demodulated amplitude modulated signal;

means for comparing said DC signal to a reference level; and means for utilizing the result of the comparison to provide a bias signal to the input of said voltage controlled oscillator.

8. The switch according to claim 6 wherein said compensation means comprises:

means for extracting a DC signal from said demodulated amplitude modulated signal;

means for comparing the phase of said demodulated amplitude modulated signal with the phase of the signal at the modulation signal source output and providing a phase comparison signal;

means for comparing the amplitude of said demodulated amplitude modulated signal with the amplitude of the signal at the modulation signal source output and providing an amplitude comparison signal; and processing means receiving said DC signal, said phase comparison signal and said amplitude comparison signal for providing a bias signal to the input of said voltage controlled oscillator.

9. The switch according to claim 8 wherein said processing means comprises a programmed microprocessor.

* * * * *